(12) United States Patent
Weber et al.

(10) Patent No.: US 6,525,978 B2
(45) Date of Patent: Feb. 25, 2003

(54) CIRCUIT CONFIGURATION FOR EVALUATING THE INFORMATION CONTENT OF A MEMORY CELL

(75) Inventors: Werner Weber, München (DE); Roland Thewes, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,417

(22) Filed: Apr. 1, 2002

(65) Prior Publication Data

US 2002/0126525 A1 Sep. 12, 2002

Related U.S. Application Data

(63) Continuation of application No. PCT/DE00/03272, filed on Sep. 20, 2000.

(30) Foreign Application Priority Data

Sep. 30, 1999 (DE) ........................... 199 47 118

(51) Int. Cl.[7] ................................................. G11C 7/02
(52) U.S. Cl. ...................... 365/207; 365/158; 365/209
(58) Field of Search ................................. 365/207, 209, 365/158

(56) References Cited

U.S. PATENT DOCUMENTS 5,059,832 A * 10/1991 Hughes ...................... 323/316
6,134,138 A     10/2000 Lu et al.

FOREIGN PATENT DOCUMENTS

EP   0 450 912 A2   10/1991
EP   0 486 901 A2   5/1992

* cited by examiner

Primary Examiner—Hoai Ho
(74) Attorney, Agent, or Firm—Laurence A. Greenberg; Werner H. Stemer; Gregory L. Mayback

(57) ABSTRACT

A description is given of a method and a circuit configuration for evaluating an information content of a memory cell, preferably of an MRAM memory cell, or of a memory cell array. In order to be able to perform accurate and reliable evaluation of the memory cell, a first current value flowing through the memory cell or a voltage value correlated with the current value is measured and conducted through a first circuit branch, which has a switch and a capacitance, and is buffer-stored. The memory cell is subsequently subjected to a programming operation. Afterward, in the same memory cell a second current value or voltage value is measured and conducted through a second circuit branch that has a switch and a capacitance and is buffer-stored there. The two measured values are compared with one another in an evaluation unit.

3 Claims, 2 Drawing Sheets

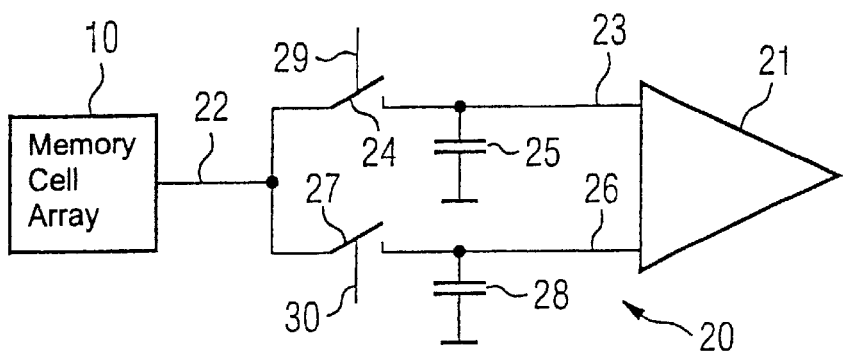
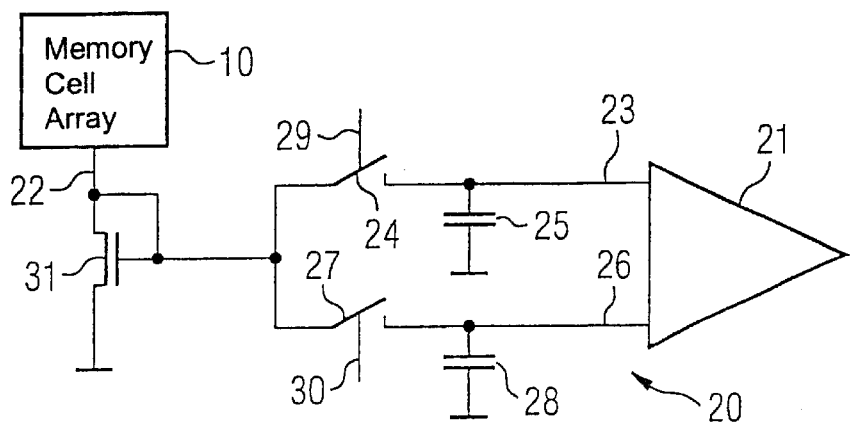
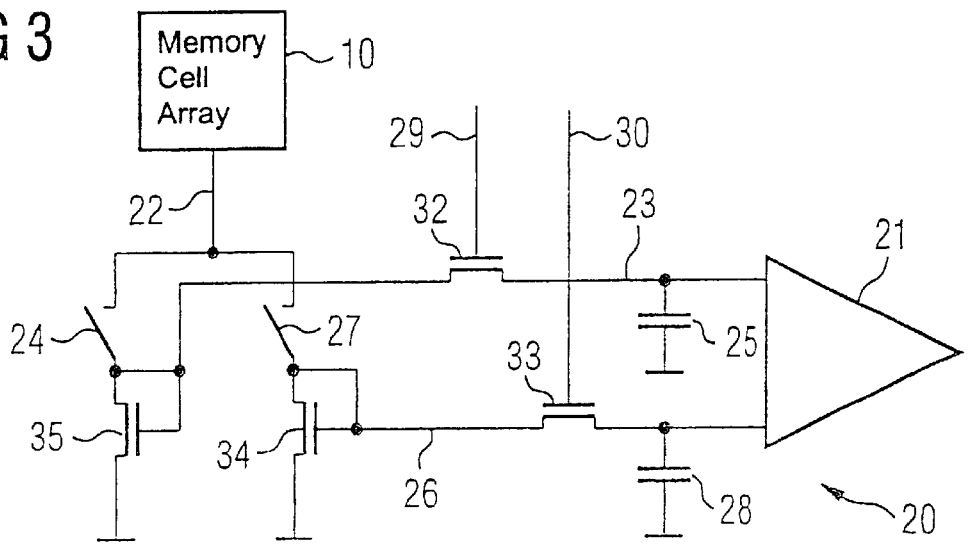

CIRCUIT CONFIGURATION FOR EVALUATING THE INFORMATION CONTENT OF A MEMORY CELL

CROSS-REFERENCE TO RELATED APPLICATIONS

This application is a continuation of copending International Application No. PCT/DE00/03272, filed Sep. 20, 2000, which designated the United States.

BACKGROUND OF THE INVENTION

FIELD OF THE INVENTION

The present invention generally relates to a method and a circuit configuration for evaluating the information content of a memory cell, preferably of a MRAM memory cell, or of a corresponding memory cell array.

Magnetoresistive random access memories (MRAMs) are memories in which data can be stored under an address and also be read out again. The memories generally have one or more memory cells (memory cell array), the memory effect residing in the magnetically variable electrical resistance of the memory cell or memory cells.

MRAM memory cells usually have a layer sequence containing a combination of ferromagnetic materials and an insulator layer respectively lying in between. The insulator layer is also referred to as a tunnel dielectric.

Depending on the magnetization state of the memory cell, the magnetization directions in the magnetic layers can be oriented in a parallel or anti-parallel manner. The memory cell has a different electrical resistance depending on the magnetization direction in the magnetic layers. In this case, a parallel magnetization direction leads to a lower electrical resistance in the memory cell, while an anti-parallel magnetization direction leads to a higher resistance.

The insulator layer may have a thickness of about 2 to 3 nm, for example. The electronic conductivity through the layer system is essentially determined by a tunnel effect through the insulator layer. Variations in the tunnel insulator thickness lead to great variations in the conductivity since the insulator thickness influences the tunneling current approximately exponentially.

When such a memory cell is written to, it is done by an electric current. To that end, the memory cell is constructed in such a way that it has two electrical conductors that cross one another. A layer sequence containing magnetic layers and a tunnel dielectric layer as described above is provided in each case at the crossover point of the electrical conductors. An electric current flows through the two conductors and in each case generates a magnetic field. The magnetic field acts on the individual magnetic layers. If the magnetic field strength is sufficiently large, the magnetic layers exposed to the field are subjected to a magnetization reversal.

The size of the magnetic field acting on the individual magnetic layers depends first on the size of the currents flowing through the two conductors, and second also on the spatial configuration of the respective magnetic layers with regard to the electrical conductors.

The current flowing through the conductors thus has the effect that the magnetization directions can change in individual magnetic layers. Depending on the magnitude of the impressed current, individual layers of the cell are subjected or are not subjected to a magnetization reversal.

If the memory cell is subsequently read or evaluated, this can be done, for example, by a corresponding programming operation. Therefore, such a high current is impressed into the electrical conductors of the memory cell that individual or a plurality of magnetic layers are subjected to magnetization reversal. If, in the event of a subsequent current measurement of the current through the cell or a voltage measurement correlated with the cell current, it is ascertained that the values have remained the same, this results in that the information content was actually already stored beforehand in the memory cell. In contrast, if the current value or voltage value changes, this results in that the information content of the memory cell has changed. As an alternative, it is also possible to detect a change in the information content by measuring the cell resistance.

If the cell is to be read, first the electrical cell resistance is measured. Published, European Patent Application EP 0 450 912 A2 describes a method for reading from an MRAM, in which an activation current is applied to the relevant memory cell, which current is directed in such a way that the magnetic field brought about by the current is directed oppositely to a common magnetization at the edges of the magnetizable memory medium.

The measured values are evaluated in corresponding evaluation circuits. In this case, the obvious approach is, in principle, the approach known from other types of memory, namely of comparing a measured current value, or a voltage value correlated therewith, with a defined reference value. The reference value is generally defined once before the beginning of the operation of the MRAM memory and applies to all the memory cells of the memory. The defined reference value functions as a threshold value which determines the information state of the memory cell depending on the state of the memory cell. If the evaluation circuit detects a current value or voltage value that lies above or below the defined reference value, the information content of the memory cell is inferred from this.

However, this form of evaluation of memory cells has a series of disadvantages. Thus, by way of example, the higher and lower currents or voltages must be sufficiently different from one another to allow reliable evaluation of the memory cell given appropriate positioning of the defined threshold. This is particularly difficult, however, since the changes in current or voltage and the resultant changes in resistance vary within limits of only about 10% and are therefore only relatively small. For this reason, the reference value must be fixed at a very precise value.

Since the MRAM memories usually contain quite a lot of memory cells, the so-called memory cell arrays, must be evaluated by a single evaluation circuit.

For technical fabrication reasons, however, it is not possible for the insulator layers in all the memory cells and between all the magnetic layers always to have exactly the same thickness. On account of these unpreventable variations in the insulator layer thickness, but also as a result of other technologically or physically governed parameter variations, variations in the cell resistance and thus also variations in the cell current can arise, which can prevent reliable evaluation of the memory cell information. For this reason, under certain circumstances, it is not possible to specify defined thresholds or reference values in order to be able to reliably evaluate all the memory cells of a predetermined memory cell array.

SUMMARY OF THE INVENTION

It is accordingly an object of the invention to provide a circuit configuration for evaluating the information content of a memory cell which overcomes the above-mentioned disadvantages of the prior art devices of this general type. In particular, the intention is to enable accurate and reliable evaluation of a memory cell or of a memory cell array.

With the foregoing and other objects in view there is provided, in accordance with the invention, a circuit configuration for evaluating an information content of a magnetoresistive random access memory (MRAM) memory cell. The circuit configuration contains a ground terminal, a line connected to the MRAM memory cell, and a component being either a resistor or a transistor connected as a diode. The component is connected between the ground terminal and the line. A first circuit branch is provided and has a first switch with a first terminal and a second terminal, the first terminal of the first switch is connected to the line. A second circuit branch is provided and has a second switch with a first terminal and a second terminal, the first terminal of the second switch is connected to the line and to the first terminal of the first switch. An evaluation unit is connected to the second terminal of the first switch and to the second terminal of the second switch. A first capacitor is connected between the second terminal of the first switch and the ground terminal. The first capacitor functions as a first buffer store for storing a first value measured from the MRAM memory cell and the first value is either a first current value or a first voltage value. After the first value is buffered stored, the MRAM memory cell is subsequently subjected to a programming operation. A second capacitor is connected between the second terminal of the second switch and the ground terminal. The second capacitor functions as a second buffer store for storing a second value measured from the MRAM memory cell and the second value is either a second current value or a second voltage value. The first value and the second value are then compared with one another in the evaluation unit.

The object is achieved, in accordance with a first aspect of the invention, by evaluating the information content of a memory cell, preferably of an MRAM memory cell, or of a memory cell array. According to the invention, the evaluation is effected by the measurement of a current flowing through the memory cell or of a voltage correlated with the current. The measured current or the voltage, for the evaluation of the information content of the memory cell, is compared with a reference current or a reference voltage, which is a reference current or a reference voltage through the same memory cell.

A basic concept underlying the invention is that the current flowing through the memory cell or a voltage value correlated with the current is no longer compared with a previously defined, fixed reference current or a reference voltage, as has been customary heretofore in the prior art. Instead, the measured value is now compared with a reference value that has likewise been determined in the same cell. In this way, it is no longer the case that a single reference value is utilized for a multiplicity of memory cells, rather a dedicated, individual reference value is in each case determined for each memory cell. Consequently, each memory cell is its own reference. This makes it possible to eliminate the previously occurring disadvantages that resulted on account of structural characteristics of the memory cells.

With regard to advantages of the invention, effects, actions and the mode of operation according to the invention, reference is likewise made to the entire contents of the explanations below concerning the circuit configuration according to the invention, since the invention can preferably be carried out using such a circuit configuration.

In order to be able to evaluate the memory cell, a first current value or voltage value can be measured and buffer-stored. The memory cell can subsequently be subjected to a programming operation as described further above. Afterward, a second current value or voltage value can be measured and, if appropriate, buffer-stored. The two measured current values or voltage values are subsequently compared with one another in an evaluation unit, for example a comparator.

The memory cell may preferably be configured as an MRAM memory cell that has a layer sequence containing at least a magnetically softer and a magnetically harder layer with an insulator layer lying in between, the layer sequence being disposed between two electrical conductors. In this case, the programming operation of the memory cell can be effected by a suitable current. If the current that flows through the electrical conductors of the memory cell and generates a magnetic field which acts on the magnetic layers situated between the conductors is large enough, the magnetically softer layer(s) can be subjected to magnetization reversal.

An illustrative example of such a method will now be described below.

In a first step, in the context of a first read operation, the current flowing through the memory cell or the voltage value correlated with the current or a corresponding electrical resistance is measured (read) and the information about this is buffer-stored. The memory cell is subsequently subjected to a corresponding programming operation. That leads either to a changeover of the memory cell or, if the memory cell was already in the target state of the programming operation, to no change in the state of the memory cell. The current or the voltage or the resistance is then again measured (second read operation). The two measured values are compared with one another in an evaluation unit. If the information of the memory cell was altered by the programming operation, then a different current flows in the second measurement. If the information content of the memory cell was not altered by the programming operation, then the same current flows. The measured values before and after the programming operation are thus only ever compared directly with one another, but not with a reference value which is defined independently thereof and generally and is to be applied to all the memory cells and may be stored in the evaluation circuit, for example.

The evaluation unit may be, for example, a sub-element of a sense amplifier. Such sense amplifiers are already known per se in the prior art, so that they are not discussed in any further detail. By way of example, sense amplifiers are used for reading DRAM memories (dynamic random access memories). Depending on the configuration of the circuit configuration used for evaluating the memory cell, it is also possible to use other simple comparator circuits as the evaluation units. Various examples of suitable evaluation units will be explained in more detail in the further course of the description, in particular with regard to the circuit configuration according to the invention.

Preferably, the first and second measured current values or voltage values may be weighted differently, in order thus to set an asymmetry in the evaluation. The setting of such an asymmetry makes it possible always to effect reliable and accurate evaluation of the memory cell even in the event of small differences in the measured current values or voltage values.

The setting of an asymmetry is important, particularly when the data of the memory cell do not change after the write operation. This will be illustrated using an example.

Suppose that a voltage value is in each case measured for the evaluation of the memory cell. Each information state of the memory cell corresponds to a specific voltage value. If the memory cell is configured as a 1-bit cell with the logic information states "0" and "1", by way of example a voltage value of 1.0 V could be measured in the case of the information state "0" and a voltage value of 1.1 V in the case of the information state "1". If, in the initial state, the memory cell is in the information state "0" and is subsequently subjected to a programming operation by the target datum "1", for example, being written to it, this change in information can be precisely evaluated using the two voltage values, which vary by 10% in the present example.

By contrast, if, in the initial state, the memory cell is already in the information state "1" and the target datum "1" is then written to it, the two voltage values ought to remain the same after the first and second measurements. On account of measurement inaccuracies in the evaluation which are caused for example by the intrinsically present noise of components and circuits and by interference signals which are generated internally within the circuit and externally to the circuit and effect cross-talk to the evaluation circuit, the decision that is to be performed by circuitry as to whether two measurement signals are identical or else slightly different is encumbered with major difficulties and is highly susceptible to interference.

In order to solve this problem of the decision as to whether the measured values are identical after the first and second measurements, the measured values are weighted differently and an asymmetry is set in the evaluation of the two values.

The asymmetry can be set in various ways. By way of example, the asymmetry can be set by an asymmetrical configuration of the circuit configuration. In a further configuration, it is possible to set the asymmetry by different time durations in which the memory cell is actively connected to the circuit configuration or the measured current values or voltage values are buffer-stored. In this case, an active connection is understood to mean that period of time in which the memory cell is actually read, or in which a corresponding value is actually measured or buffer-stored.

A more detailed description of how such asymmetries can be realized is given with regard to the circuit configuration according to the invention, so that, at this point, for this purpose, reference is made to the entire contents of the explanations below, which are hereby incorporated by reference.

In the example mentioned, the setting of the asymmetry can also be affected, for example, by a suitable offset circuit that, for example, alters the first measured value by adding to it, for example, a voltage amount of an additional 5%.

If the memory cell is again in the information state "0" in the case of the first measurement, what is buffer-stored in this case is not a voltage value of 1.0 V, but rather a voltage value of 1.05 V, increased by 5% on account of the offset circuit. The memory cell is subsequently subjected to the programming operation, with the result that it is then in the information state "1". The voltage is then measured again, but this time without addition of an offset voltage. In accordance with the example, the voltage value turns out to be 1.1 V in the case of the second measurement. The two measured voltage values are compared in the evaluation unit. Since the first measured value is less than the second measured value, the evaluation circuit can thereby clearly recognize that the information content of the memory cell has changed.

If, in the initial state, the memory cell is already in the information state "1", a voltage value of about 1.16 V, correspondingly increased by 5%, is buffer-stored on account of the addition of the offset in the case of the first measurement. The target datum "1" is subsequently written to the memory cell. The second measured value is then recorded, which yields a voltage value of 1.1 V since an offset was not added for the second measured value. The two measured or stored voltage values are compared in the evaluation unit. Since the first measured value is greater than the second measured value, the evaluation circuit can thereby clearly recognize that the information content of the memory cell has not changed.

The setting of a suitable asymmetry makes it possible to avoid the problem of deciding whether two measured values have the same magnitude. Rather, the evaluation circuit must only be able to recognize whether the individual measured values are respectively larger or smaller with regard to one another.

The present example merely serves for the basic explanation of the advantageous setting of an asymmetry, without circumscribing the scope of protection of the present invention to this concrete example.

The second aspect of the present invention provides a circuit configuration for evaluating the information content of a memory cell, preferably of an MRAM memory cell, or of a memory cell array, in particular for use with a method according to the invention as described above, the circuit configuration being connected to the memory cell via a line, for example a bit line. The circuit configuration has a first circuit branch, which has a switch and a capacitance, in order to buffer-store a first current value or a voltage value correlated therewith, and a second circuit branch, which has a switch and a capacitance, in order to buffer-store a second current value or a voltage value correlated therewith, the circuit branches are connected to an evaluation unit for the purpose of comparing the current values or the voltage values correlated therewith.

In the circuit configuration according to the invention, the current value or the voltage value correlated therewith of the first read operation of the memory cell is buffer-stored in the first circuit branch. This is done by a corresponding setting of the switches, so that the capacitance can be charged. The memory cell is subsequently subjected to the programming operation, as has already been described with regard to the method according to the invention. Afterward, the current value or the voltage value correlated therewith is again measured (second read operation of the memory cell). This value is buffer-stored in the capacitance of the second circuit branch by a corresponding setting of the switches. The two stored values are compared with one another in the evaluation unit connected to the two circuit branches, which evaluation unit may be configured as a simple comparator, for example. This makes it possible to perform an evaluation of the memory cell as has already been described with regard to the method according to the invention.

In addition, with regard to the advantages, effects, actions and the mode of operation of the circuit configuration according to the invention, reference is also made to the entire contents of the explanations above concerning the method according to the invention.

The circuit configuration may advantageously be configured in such a way that different weightings are set or can be set for the first and second measured current values or voltage values, which weightings lead to an asymmetry in the evaluation. As has already been explained further above, in connection with the method according to the invention, the setting of such an asymmetry is particularly expedient when the data of the cell do not change before and after the write operation.

In order to set a suitable asymmetry, by way of example, the evaluation unit may be configured as an asymmetrical component. The evaluation unit may be provided, for example, with a corresponding offset circuit that alters the measured value in a specific manner. This has been illustrated using the example described further above.

In a further configuration, the circuit configuration may be configured in such a way that the asymmetry is set or can be set by different time durations in which the memory cell is actively connected to the circuit configuration or the measured current values or voltage values are buffer-stored in the circuit branches.

In such a case, the evaluation unit may be configured symmetrically, so that it may be configured for example as a simple, cost-effective comparator circuit.

If a circuit configuration as described further above is chosen, the different time durations can be set for example by way of the opening times of the switches, and hence charging times of the capacitances, having different lengths. Here, however, such a solution requires precise temporal supervision of the respective control pulses for opening and closing the switches.

In order to be able to carry out the setting of the asymmetry independently of precise temporal supervision, it can advantageously be set by the circuit configuration itself. In this case, the circuit configuration is more robust relative to possible variations in the time profile of the control pulses that determine the lifetime of the storage capacitances.

An element for converting a current of the memory cell into a voltage may preferably be provided in the line between the circuit configuration and the memory cell. The element may advantageously, but not exclusively, be configured as a transistor and/or as at least one electrical resistor, in particular as a linear or nonlinear resistor. In the element, for example the transistor, the current supplied by the memory cell to be read is converted into a voltage that is stored in the various capacitances given appropriate setting of the switches. The switches in each case need to be closed only until it can be assumed that the capacitances have been charged to the full value of the voltage at the transistor. However, this time determination can be carried out significantly less accurately than the setting of the time duration as described further above. The different voltage values are compared with one another in the evaluation unit, which is advantageously configured as an asymmetrical evaluation unit.

In a further configuration, the asymmetry may be set or be able to be set by asymmetrical circuit branches. In this case, a symmetrical evaluation unit may be used for comparing the measured values, which unit is configured as a simple comparator circuit, for example.

Asymmetrical circuit branches can be provided for example by an element for converting a current of the memory cell into a voltage being provided in each case in the first and second circuit branches, and by the elements being dimensioned differently. By way of example—but not exclusively—the elements may be configured as transistors and/or in each case as an electrical resistor, in particular as a linear or nonlinear resistor.

In another configuration, a further aspect of the present invention provides a circuit configuration for evaluating the information content of a memory cell, preferably of an MRAM memory cell, or of a memory cell array, which is suitable, in particular, for carrying out a method according to the invention, as described further above. In this case, the circuit configuration is connected to the memory cell via a line. The circuit configuration has an evaluation unit which is electrically connected to at least one current mirror circuit, by which an asymmetry is set or can be set for the evaluation of the two current values or voltage values.

Reliable and accurate evaluation of the memory cell(s) can likewise be performed by such a circuit configuration. With regard to the advantages, actions, effects and the mode of operation of the circuit configuration, reference is likewise made to the entire contents of the explanations above regarding the method according to the invention and the other configuration of the circuit configuration, which are hereby incorporated by reference.

In this further embodiment of a circuit configuration according to the invention, use is made of a current mirror circuit that is known per se in the prior art. A current mirror circuit supplies at its output an amplified or attenuated copy of the input current, that is to say operates as a current-controlled current source.

The current mirror circuit may advantageously have two differently dimensioned transistors and also a capacitance, in order to buffer-store the first current value or voltage value correlated therewith. The capacitance need not be configured as an autonomous component, but rather may be configured for example as the gate capacitance of one of the transistors. Furthermore, it is possible to provide a number of switches that are, or have been, switched differently during the measurement of the first and second current values or voltage values.

By appropriate setting of the individual switches, the information content of the memory cell is stored as a voltage value in the capacitance in the first read operation. The memory cell is then subjected to a corresponding programming operation. During the second read operation that takes place after the programming of the memory cell, the switches are set in such a way that the current can flow via the larger dimensioned transistor. By way of example, the transistor may have a width of W+ΔW, while the other, smaller dimensioned transistor has only a width of W. The transistor having the larger width operates as a current source and generates a current corresponding to (1+ΔW/W) times the current of the first read operation.

The circuit configuration may have, for example, a gain A of $$A = gm/(gDS + 1/Rz)$$

with the memory cell resistance Rz, the drain conductance gDS and the transconductance gm of the transistor. The gain leads to a high amplitude at the input of the evaluation unit, which, in this case, can be realized, for example as a simple comparator circuit (with a noncritical reference of about VDD/2).

A cascaded current mirror circuit may advantageously be provided, which leads to a larger gain of the circuit.

The memory cell may preferably be configured as an MRAM memory cell having a layer sequence of in each case at least a soft-magnetic and a hard-magnetic layer with an insulator layer arranged in between. Such memory cells, which have already been explained extensively in connection with the description of the prior art, are particularly suitable for being evaluated by a circuit configuration according to the invention.

Other features which are considered as characteristic for the invention are set forth in the appended claims.

Although the invention is illustrated and described herein as embodied in a circuit configuration for evaluating the information content of a memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of a first embodiment of a circuit configuration according to the invention;

FIG. 2 is a block circuit diagram of a second embodiment of the circuit configuration according to the invention;

FIG. 3 is a block circuit diagram of a third embodiment of the circuit configuration according to the invention;

DESCRIPTION OF THE PREFERRED EMBODIMENTS

Figure 4:
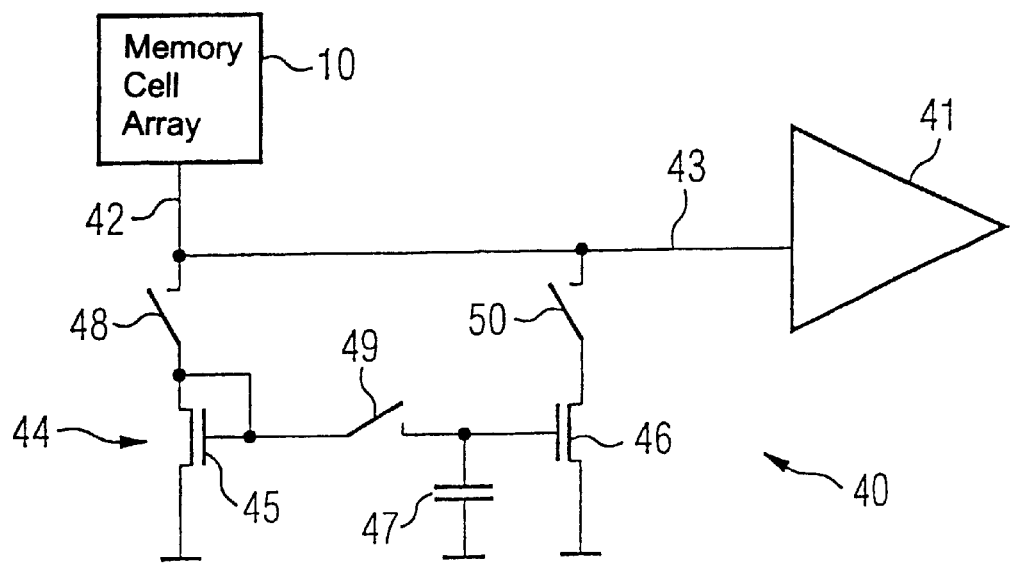
FIG. 4 is a block circuit diagram of a fourth embodiment of the circuit configuration according to the invention.

Referring now to the figures of the drawing in detail and first, particularly, to FIGS. 1–5 thereof, there are shown circuit configurations 20, 40 which are used for evaluating an information content of a magneto-resistive memory cell (MRAM) 10 or of a corresponding memory cell array. For the sake of better clarity, the circuit configurations 20, 40 and the methods for evaluating the information content are described only in connection with a single memory cell 10.

The storage effect of the MRAM memory cell 10 is based on a magnetically variable electrical resistance of the memory cell 10. To that end, the memory cell 10 generally has a layer sequence of in each case at least a soft-magnetic and a hard-magnetic layer with an insulator layer lying in between. In order to write an information item to the memory cell 10, the it soft-magnetic layer(s) either is/are or is/are not subjected to a magnetization reversal.

According to the basic concept of the present invention, the memory cell 10 is read or the information content of the memory cell 10 is evaluated, in such a way that a first current value flowing through the memory cell 10 or a voltage value correlated with the current value is measured and buffer-stored (first read-out of the memory cell). The memory cell 10 is subsequently subjected to a programming operation, after the conclusion of which the soft-magnetic layer in any event has the magnetization direction corresponding to the target datum, or the cell contains the target datum as information.

A current measurement or a voltage measurement is then performed again (second read-out of the memory cell). The first and second measured current values or voltage values are compared with one another. If the information of the memory cell was altered, a different current flows in the case of the second measurement. If the information of the memory cell 10 was not altered by the programming operation, the current value or voltage value remains the same.

This type of evaluation of the memory cell makes it possible for the current values or the voltage values always to be compared with a reference value through the same memory cell 10. As a result, a respective individual reference value is available for each memory cell 10, so that the disadvantages described with regard to the prior art can be avoided.

The individual current values or voltage values are buffer-stored, assessed and evaluated in the circuit configurations 10, 40, a few exemplary embodiments of which are described below.

FIG. 1 illustrates the circuit configuration 20, which is connected to the memory cell 10 via a line 22, for example a bit line. The circuit configuration 20 has a first circuit branch 23 and a second circuit branch 26, which are each connected to an evaluation unit 21.

The evaluation unit 21 may be, for example, part of a sense amplifier which is already known in practice and is used in various ways, for example for reading DRAM memories.

Each of the two circuit branches 23, 26 has a switch 24, 27 and a capacitance 25, 28. The circuit configuration is controlled by corresponding control pulses 29, 30.

When the first current value or voltage value is measured, which is referred to as reading the memory cell 10, the state of the first read operation is buffer-stored in the upper branch 23 of the circuit configuration 20. This is done by closing the switch 24 for a predetermined time duration and the charging of the upper capacitance 25 which is brought about by this, the switch 27 being open. After the programming operation, during which both switches 24, 27 are in the open state, the switch 27 is closed for a specific time duration and the lower capacitance 28 is charged, the switch 24 being open. An evaluation unit 21 is subsequently activated, which compares the voltages in both circuit branches 23, 26 and thus performs an evaluation of the information of the memory cell 10. The circuit configuration according to FIG. 1 requires precise temporal supervision of the control pulses 29, 30.

In order also to be able to reliably evaluate identical or very similar current values/voltage values or resultant input signals for the evaluation unit 21, it is advantageous that they acquire a preferred direction. This can be achieved by setting an asymmetry for the evaluation for the current values or voltage values. The effect and the advantage of such asymmetrical evaluation concepts has already been described extensively above.

The asymmetry can be affected for example by a correspondingly asymmetrical configuration of the evaluation unit 21. Furthermore, it is also conceivable for the individual circuit branches to be made asymmetrical. In the exemplary embodiment according to FIG. 1, an asymmetry can also be achieved by choosing time periods of different lengths for the closing of the switches 24, 27 and the associated charging duration of the capacitances 25, 28.

In the subsequent circuit configurations according to FIGS. 2 to 5, the charging operation of the capacitances and thus the measurement of the current values or voltage values to be compared is to be controlled not by the time duration but by the circuit configuration itself. This makes it possible to further improve the robustness of the evaluation of the memory cells 10.

FIG. 2 illustrates the circuit configuration 10 whose basic construction approximately corresponds to the construction of the circuit configuration according to FIG. 1. Therefore, identical elements are provided with identical reference numerals, a renewed description of the features and elements that have already been described above with regard to FIG. 1 are dispensed with. In contrast to FIG. 1, the circuit configuration 20 according to FIG. 2 has a transistor 31 disposed in the line 22 by which the memory cell 10 is connected to the circuit configuration 20.

In the case of the circuit configuration 20 according to FIG. 2, for the first read operation of the memory cell 10, the switch 27 is opened and the switch 24 is closed. For the second read operation, the switch 24 is opened and the switch 27 is closed.

The actual evaluation of the information content of the memory cell 10 is effected as follows. The current supplied by the memory cell 10 to be read is converted into a voltage by the transistor 31, connected as a diode in this case, at the gate-drain node. The voltage is buffer-stored on one of the two capacitances 25, 28 depending on the switch setting. In this case, it is assumed that the periods of time during which the switches 24, 27 are closed are in each case chosen to be long enough to charge the capacitances 25, 28 to the full value of the voltage at the transistor 31. The circuit configuration 20 according to FIG. 2 and the method for evaluating the information content of a memory cell which can be carried out by the circuit configuration are more robust relative to variations in the time profile of the control pulses 29 and 30. Instead of the transistor 31, it is also possible to use, for example, a linear or nonlinear resistor. All that is crucial is that the current value of the memory cell 10 can be converted into a voltage.

The individual voltage values can be compared with one another in the evaluation unit 21. In order to obtain a desired asymmetry with the advantages described further above, the evaluation unit 21 is preferably configured asymmetrically in the case of the exemplary embodiment according to FIG. 2.

In the case of the circuit configuration 20 illustrated in FIG. 3, the asymmetry is realized not by an asymmetrical evaluation unit 21 but by asymmetrical circuit branches 23, 26. Consequently, it is possible to use any customary comparator circuit as the evaluation unit 21.

In contrast to the circuit configuration from FIG. 2, the circuit configuration 20 has two transistors 32, 33 that function as switches and are actuated by the control pulses 29, 30.

Furthermore, a transistor 35 is provided in the circuit branch 23 and a transistor 34 is provided in the circuit branch 26. The two transistors 35, 34 are dimensioned differently in order to obtain the asymmetry in the circuit branches 23, 26. By way of example, the transistor 35 has a width of W+ΔW, while the transistor 34 has only a width W. Instead of the transistors 34, 35, it is again possible to use resistors with correspondingly different values.

On account of the cell information, a different current or voltage conversion is produced by the transistors 34, 35. The values are buffer-stored in the capacitors 25, 28 and subsequently compared or evaluated in the evaluation unit 21, which may be configured as a simple comparator.

FIG. 4 illustrates a further embodiment of the circuit configuration 40. The circuit configuration 40 is connected to the memory cell 10 via a line 42, for example a bit line. The circuit configuration 40 has an evaluation unit 41, which is connected to a current mirror circuit 44 via an electrical line 43. The current mirror circuit 44 has two transistors 45, 46, which are dimensioned differently, a capacitance 47 for buffer-storing the measured values and also a number of switches, three switches 48, 49, 50 in the present case.

The circuit configuration 40 functions as follows. For the first read operation of the memory cell 10, the switches 48, 49 are closed while switch 50 is open. The information of the memory cell 10 is stored as voltage in the capacitance 47. In this case, the capacitance 47 need not necessarily be configured as an autonomous component. Rather, it may also be configured as the gate capacitance of the transistor 46.

During the read operation that takes place after the programming of the memory cell 10, the switch 50 is closed, while the other two switches 48 and 49 are open. As a result, the current can flow via the transistor 46. The transistor 46 is dimensioned differently in comparison with the transistor 45. By way of example, it may have a width of W+ΔW, while the transistor 45 has only a width of W. The transistor 46 operates as a current source and generates a current that corresponds to (1+ΔW/W) times the current of the first read operation. The circuit configuration 40 according to FIG. 4 has a specific gain which leads to a high amplitude at the input of the evaluation unit 41, which may be realized for example as a simple comparator circuit in this case.

Figure 5:
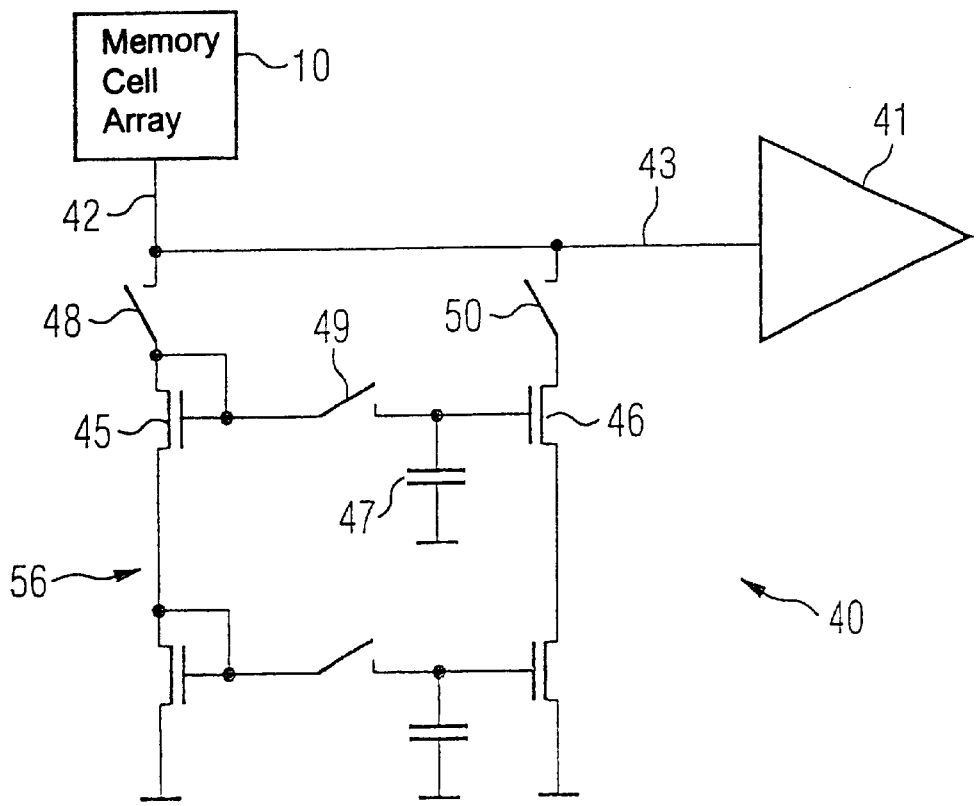
FIG. 5 is a block circuit diagram of a modified embodiment of the circuit configuration in accordance with FIG. 4.

The circuit configuration 40 according to FIG. 5 is a modification of the circuit configuration 40 according to FIG. 4. The circuit configuration 40 according to FIG. 5 has a cascaded current mirror circuit 56. The circuit configuration according to FIG. 5 has an even higher gain than the circuit configuration illustrated in FIG. 4.

We claim:

1. A circuit configuration for evaluating an information content of a memory cell, the circuit configuration comprising:
    a line connected to the memory cell;
    an evaluation unit;
    a first switch-connected to said line;
    a second switch connected to said line;
    at least one current mirror circuit electrically connected to said evaluation unit through said first switch and said second switch, said current mirror circuit asymmetrically measuring at least one of a first measured value and a second measured value of the memory cell, said current mirror circuit having a first transistor with a gate terminal and connected to said line through said first switch, said current mirror circuit further having a second transistor with a gate terminal and connected to said line through said second switch;
    a third switch connected between said gate terminal of said first transistor and said gate terminal of said second transistor; and
    a capacitance connected to said gate terminal of said second transistor.

2. The circuit configuration according to claim 1, wherein:
    said first transistor and said second transistor are differently dimensioned with respect to each other;
    said capacitance buffer-stores the first measured value; and
    said first switch, said second switch and said third switch are switched differently during a measurement of the first measured value and the second measured value.

3. The circuit configuration according to claim 1, wherein said current mirror circuit is a cascaded current mirror circuit.

* * * * *